(12) United States Patent
Do et al.

(10) Patent No.: US 8,156,460 B2
(45) Date of Patent: Apr. 10, 2012

(54) METHOD OF ESTIMATING A LEAKAGE CURRENT IN A SEMICONDUCTOR DEVICE

(75) Inventors: Kyung-Tae Do, Gyeongsangnam-do (KR); Jung-Yun Choi, Gyeonggi-do (KR); Bong-Hyun Lee, Gyeonggi-do (KR); Young-Hwan Kim, Gyeongsangbuk-do (KR); Hyo-Sig Won, Gyeonggi-do (KR); Wook Kim, Gyeongsangbuk-do (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 314 days.

(21) Appl. No.: 12/547,729

(22) Filed: Aug. 26, 2009

(65) Prior Publication Data

US 2010/0058258 A1 Mar. 4, 2010

(30) Foreign Application Priority Data

Aug. 28, 2008 (KR) ........................ 10-2008-0084718

(51) Int. Cl.
*G06F 17/50* (2006.01)
(52) U.S. Cl. ........................ 716/109; 716/100
(58) Field of Classification Search .................. 716/100, 716/109, 136
See application file for complete search history.

(56) References Cited

U.S. PATENT DOCUMENTS

| 6,842,714 B1 | 1/2005 | Acar et al. |
| 7,137,080 B2 | 11/2006 | Acar et al. |
| 2005/0060103 A1 | 3/2005 | Chamness |

OTHER PUBLICATIONS

Chang et al., "Full-Chip Analysis of Leakage Power Under Process Variations, Including Spatial Correlations", Jun. 2005, IEEE, Proceedings of Design Automation Conference, pp. 523-528.*
Srivastava et al., "Accurate and Efficient Gate-Level Parametric Yield Estimation Considering Correlated Variations in Leakage Power and Performance", Jun. 2005, IEEE, Proceedings of Design Automation Conference, pp. 535-540.*
Li et al., "Projection-Based Statistical Analysis of Full-Chip Leakage Power with Non-Log-Normal Distributions", Jun. 2006, IEEE, Proceedings of Design Automation Conference, pp. 103-108.*

* cited by examiner

*Primary Examiner* — Sun Lin
(74) *Attorney, Agent, or Firm* — Myers Bigel Sibley & Sajovec, P.A.

(57) ABSTRACT

In a method of estimating a leakage current in a semiconductor device, a chip including a plurality of cells is divided into segments by a grid model. Spatial correlation is determined as spatial correlation between process parameters concerned with the leakage currents in each of the cells. A virtual cell leakage characteristic function of a cell is generated by arithmetically operating actual leakage characteristic functions. A segment leakage characteristic function of a segment is generated by arithmetically operating the virtual cell leakage characteristic functions of all cells in the segment. Then, a full chip leakage characteristic function of the chip is generated by statistically operating the segment leakage characteristic functions of all segments in the chip. Accordingly, computational loads of Wilkinson's method for generating the full chip leakage characteristic function can remarkably be reduced.

20 Claims, 2 Drawing Sheets

METHOD OF ESTIMATING A LEAKAGE CURRENT IN A SEMICONDUCTOR DEVICE

REFERENCE TO PRIORITY APPLICATION

This application claims priority to Korean Patent Application No. 2008-84718, filed Aug. 28, 2008, the contents of which are hereby incorporated herein in its entirety.

FIELD OF THE INVENTION

Example embodiments relate to a method of estimating a leakage current in a semiconductor device, and more particularly, to a method of simulating and estimating a full chip leakage current for integrated circuit designs in a semiconductor device.

BACKGROUND

As degrees of integration of semiconductor devices are increased and the sizes of semiconductor devices are decreased, serious problems with regard to the generation of leakage current are increasing. Thus, leakage estimation and reduction techniques have been one of the most important design factors in manufacturing an integrated circuit. The increasing amounts of leakage current not only prevent normal operation of the integrated circuit but also consume excessive driving power, and thus it is increasingly critical for the device performance of the integrated circuit. Particularly, battery-powered devices including integrated circuits, such as mobile and handheld electronics, have recently become widespread, and thus the excessive power consumption has been a critical factor for the performance of the battery-powered devices. For those reasons, the leakage estimation and reduction techniques have become much more important factors in designing the ICs.

Most of the leakage estimation and reduction techniques have focused on sub-threshold leakage due to lowering of power supply voltages and accompanying reductions of threshold voltages. However, with the recent high degrees of integration and the decreases in the sizes of ICs, the gate leakage current occurring at a gate electrode of the ICs, as well as the sub-threshold leakage current, has also become important factors in designing the ICs. Accordingly, accurate full chip leakage estimation is frequently required for a chip design of the ICs so as to estimate both of the sub-threshold leakage and the gate leakage. Particularly, in recent very large-scale integration (VLSI) chips, tunneling of carriers through a gate insulation layer may frequently occur due to a reduced thickness of the gate insulation layer, and thus the estimation of the gate leakage necessarily needs to be considered in designing the VLSI chips.

Various estimation models for estimating the full chip leakage have been suggested for the last few years. It is well known that the full chip leakage in a chip may be influenced by various factors, such as process parameters, for example, a line width and a critical dimension (CD) of a pattern, and environmental factors, for example, channel temperature, power supply voltage (Vdd), circuit topology and an allowable load. Thus, a specific estimation model for estimating the full chip leakage with respect to a specific factor does not give sufficiently accurate information on the full chip leakage in a chip.

Therefore, statistical models have been suggested for the full chip leakage estimation model in which conventional experimental results are operated by well-known statistical methods and the full chip leakage is estimated in consideration of all of the above factors including the process parameters and the environmental factors. Particularly, a log normal estimation model has been most widely used for the full chip leakage estimation model among the above statistical models. According to the lognormal estimation model, every factor of the process parameters and the environmental factors functions as a random variable for a probability density function (PDF), and thus a lognormal PDF is generated with respect to each of the various process parameters and the environmental factors. Then, each of the lognormal PDFs is functionally summarized into a single composite probability function, and an optimal point is determined by using the single composite probability function where the full chip leakage is minimized in consideration of all of the above factors. The values of the random variables at the optimal point of the single composite probability function are regarded as optimal design factors for minimizing the full chip leakage in a chip. The random variable of the lognormal PDF is an exponential of the random variable of a normal PDF, and thus the multiplication of the lognormal random variables is also distributed in accordance with a lognormal distribution. For those reasons, the lognormal variable has been widely used for statistical estimation and analysis for a situation where the statistical error is strongly influenced by multiplication of environmental factors.

However, the statistical estimation model for the full chip leakage using the lognormal PDF (hereinafter referred to as lognormal leakage estimation model) has a critical demerit of computational complexity. Particularly, the computational complexity of the lognormal leakage estimation model may be geometrically increased as the number of the environmental factors related to the statistical error of the lognormal leakage estimation model. Thus, the lognormal leakage estimation model has many limitations when being applied to a circuit design.

According to a conventional lognormal leakage estimation model, a semiconductor chip is divided into a plurality of estimation regions by a grid and the lognormal PDF is generated at each of the estimation regions. Then, each of the lognormal PDFs at the estimation regions is statistically summed up in consideration of spatial correlation between the estimation regions, to thereby generate a full chip lognormal PDF indicating probability of a leakage current from a whole chip on the wafer.

Particularly, the probability of the leakage current at an arbitrary cell l of the chip is expressed as follows when the leakage current is influenced by an arbitrary environmental factor i.

$$I_i^l = e^{a_0 + \sum_{j=1}^n a_j P_j + a_{n+1} R} \qquad (1)$$

The polynomial term in the above exponential equation (1) indicates a normal distribution having an average of $a_0$ and a variation of $\Sigma a_j^2$ on condition that the parameters $P_j$ and R may be distributed as a standard normal distribution N(0,1) Accordingly, the leakage current at an arbitrary cell is calculated by equation (1) on a whole chip, and thus is distributed on the whole chip as a lognormal distribution.

In the above equation (1), the parameter $P_j$ is a global parameter indicating outer environment factors at each of the chips. That is, the parameter $P_j$ includes a random variable indicating random variation in a manufacturing process for a semiconductor device. The random variable of the individual chip includes a variation of a die-to-die parameter in which the parameter may be uniformly varied on the whole chip and a variation of a within-die-parameter in which the parameter may be non-uniformly varied on the whole chip, and thus the variation of the within-die-parameter may be expressed by spatial correlation.

In addition, the parameter R in the above equation (1) is a local parameter as a single random variable into which various independent variables are grouped. The independent variable has an individual effect on the current leakage at a local area of the chip irrespectively of other variables. A plurality of the independent variables can be treated as a single variable without any computational error in equation (1), and thus the number of the variables is remarkably reduced in conducting equation (1) to thereby significantly reduce the computational load.

Further, $a_0$, $a_j$, $a_{n+1}$, in equation (1) are fitting coefficients for transforming the distribution of the probability function expressed by equation (1) into a normal distribution and indicate correlation between the global parameter or the local parameter and the leakage current. When the probability function of equation (1) including the global parameter and the local parameter is transformed into the normal distribution, multiplication of the lognormal distribution is transformed into summation of the standard normal distribution, to thereby significantly reduce the computational load when performing a leakage estimation process.

Since the leakage current at an arbitrary cell is calculated by equation (1) with respect to a specific input factor, an average leakage current over a whole chip (full chip leakage current) with respect to all of the input factors may be calculated by the following equation (2).

$$I_{avg} = \sum_{l=1}^{p}\left(\sum_{i=1}^{m} Pr_i I_i^l\right) = \sum_{l=1}^{p}\left(\sum_{i=1}^{m} Pr_i e^{a_0 + \sum_{j=1}^{n} a_j p_j + a_{n+1} R}\right) \quad (2)$$

In the above equation (2), $Pr_i$ indicates a probability that an arbitrary input factor i may be applied to an arbitrary cell l of the chip and the number of the input factors is m and number of the cells on the chip is p.

As shown in the above equation (2), the full chip leakage current is calculated through the summation of the lognormal distribution and Wilkinson's method has been widely used for the summation of the lognormal distribution.

According to Wilkinson's method, a single lognormal distribution, which may be statistically equivalent to the summation of a number of the individual lognormal distributions, is generated by using a first moment and a second moment as follows.

$$e^{Y_1} + e^{Y_2} + \ldots + e^{Y_n} = e^Z \quad (3)$$

In the above equation (3), each of the probability distributions $Y_i$ includes a normal distribution having an average of $\mu_{Y_i}$ and a standard variation of $\sigma_{Y_i}$. Supposing that the probability distribution Z of the equivalent lognormal probability function is a normal distribution having an average of $\mu_z$ and a standard variation of $\sigma_z$, the first and second moments of the equivalent lognormal distribution are expressed as follows.

$$\mu_1 = E[e^{Y_1} + e^{Y_2} + \ldots + e^{Y_n}] = e^{\mu_z + \frac{\sigma_z^2}{2}} \quad (4)$$

-continued $$\mu_2 = E[(e^{Y_1} + e^{Y_2} + \ldots e^{Y_n})^2] \quad (5)$$
$$= e^{2\mu_z + 2\sigma_z^2}$$
$$= \sum_{i=1}^{n} e^{2\mu_{Y_i} + 2\sigma_{Y_i}^2} + 2\sum_{i=1}^{n-1}\left(\sum_{j=i+1}^{n} e^{\mu_{Y_i} + \mu_{Y_j} + \frac{\sigma_{Y_i}^2 + \sigma_{Y_j}^2 + 2r_{ij}\sigma_{Y_i}\sigma_{Y_j}}{2}}\right)$$

In the above equation (5), $r_{ij}$ indicates a correlation coefficient between the different probability distributions $Y_i$ and $Y_j$.

Solutions of the simultaneous equations (4) and (5) provide the average and the standard deviation of the probability distribution Z, to thereby determine the lognormal distribution Z. Then, the full chip leakage current is estimated by the lognormal distribution Z.

However, as shown in the second term of equation (5), the correlation coefficients between the different probability distributions usually cause a tremendous computational load in operating the statistical summation of equation (5), to thereby significantly increase the operation complexity of equation (5).

The operation complexity of the lognormal distribution model is determined by the number of the individual lognormal distributions and is expressed as $O(N^2)$. N is the number of the individual lognormal distributions that are to be statistically summed up in calculating the first and second moments. According to the conventional lognormal distribution model for estimating the full chip current leakage, a number of (NC*M) of the independent lognormal distributions are generated when the full chip includes a number of NC of the cells and the kinds of the current leakage is a number of M and the operation complexity of Wilkinson's method is calculated as $O((NC*M)^2)$. Therefore, the operation complexity is extremely increased when Wilkinson's method is performed on a relatively large size of an electric circuit and finally exceeds the operation capability of the current computer systems. Particularly, when the degree of integration of semiconductor devices is increased, and thus a plurality of electric circuits is integrated into a small area of a substrate, the operation complexity of Wilkinson's method is further increased and finally Wilkinson's method cannot be substantially applied for estimating the full chip leakage.

For the above reasons, there is still a need for an improved estimation model for estimating the full chip leakage current in which the full chip leakage current is accurately estimated with a relatively low operation complexity.

SUMMARY

Example embodiments provide a method of estimating a full chip leakage current for a semiconductor device.

According to some example embodiments, there is provided a method of estimating a leakage current in semiconductor device. At first, a chip on a substrate may be divided into a number of segments. The chip may include a plurality of cells on which various unit conductive structures of an integrated circuit is formed. Spatial correlation may be determined between process parameters that are concerned with the leakage currents in each of the cells. A virtual cell leakage characteristic function of the cell may be generated by arithmetically operating actual leakage characteristic functions that determine the leakage currents generated from the cell, respectively. The virtual cell leakage characteristic function may be equivalent to actual leakage characteristic functions and a virtual leakage current generated by the virtual cell leakage characteristic function may be equivalent with the leakage currents in the cell. A segment leakage characteristic function may be generated by arithmetically operating the virtual cell leakage characteristic functions of each cell in the segment. The segment leakage characteristic function may determine a virtual leakage current generated from all of the segments of the chip. A full chip leakage characteristic function may be generated by statistically operating the segment leakage characteristic functions of each segment in the chip. The full chip leakage characteristic function may determine a virtual leakage current generated from the whole chip of the semiconductor device.

In an example embodiment, the actual leakage characteristic function and the virtual cell leakage characteristic function is expressed as an exponential polynomial with respect to the process parameter.

For example, the actual leakage characteristic function may include a first probability density function (PDF) determining a first leakage current caused by the process parameter and expressed as equation (1) and a second PDF determining a second leakage current caused by the process parameter and expressed as equation (2), $$e^{f_1(P_1, P_2, \ldots, P_n)} \quad (1),$$

$$e^{f_2(P_1, P_2, \ldots, P_n)} \quad (2).$$

The virtual cell leakage characteristic function may include a third PDF that equals arithmetic summation of the first and the second PDFs, and is thus expressed as equation (3), $$e^{f_3(P_1, P_2, \ldots, P_n)} = e^{f_1(P_1, P_2, \ldots, P_n)} + e^{f_2(P_1, P_2, \ldots, P_n)} \quad (3)$$

(wherein the small capital letters e in the above equations indicates a natural log and pi indicates the process parameter that causes the leakage current in the cell).

In an example embodiment, an exponential term of the first PDF may include a polynomial of a normal distribution having an average of $\alpha_0$ and a variation of $$\sum_{j=1}^{n+1} a_j^2$$

so that the first PDF may be expressed as equation (4) indicating a lognormal distribution, $$e^{a_0 + \sum_{j=1}^{n} a_j P_j + a_{n-1} R}. \quad (4)$$

An exponential term of the second PDF includes a polynomial of a normal distribution having an average of $b_0$ and a variation of $$\sum_{j=1}^{n+1} b_j^2$$

so that the second PDF is expressed as equation (5) indicating a lognormal distribution, $$e^{b_0 + \sum_{j=1}^{n} b_j P_j + b_{n-1} R}. \quad (5)$$

An exponential term of the third PDF may include a polynomial of a normal distribution having an average of $c_0$ and a variation of $$\sum_{j=1}^{n+1} c_j^2$$

so that the second PDF is expressed as equation (6) indicating a lognormal distribution, $$e^{c_0 + \sum_{j=1}^{n} c_j P_j + c_{n-1} R}, \quad (6)$$

on condition that $$c_0 = 2\ln(M_1) - \frac{1}{2}\ln(M_2),$$

$$\sum_{j=1}^{n+1} c_j^2 = \ln(M_2) - 2\ln(M_1),$$

$$c_j = \frac{E(e^{f_1})e^{\sum_{j=1}^{n} a_j k_j} a_j + E(e^{f_2})e^{\sum_{j=1}^{n} b_j k_j} b_j}{E(e^{f_3})e^{\sum_{j=1}^{n} c_j k_j}}, \text{ and}$$

$$c_{n+1} = \sqrt{\sigma_c^2 - \sum_{j=1}^{n} c_j^2},$$

wherein a, b and c denotes a fitting coefficient of a normal distribution, M1 and M2 denotes first and second moments of the third PDF, R denotes a local parameter by which the first and the second leakage currents are generated independently from each other and P denotes a global parameter by which both of the first and the second leakage currents are commonly generated.

The first and second moments of the third PDF may be statistically obtained as follows:

$$M_1 = E[e^{f_1} + e^{f_2}], M_2 = E[(e^{f_1} + e^{f_2})^2].$$

The fitting coefficient $c_j$ is obtained through the following steps: firstly, a second moment equivalence condition of a lognormal distribution composition may be applied on condition that an arbitrary lognormal distribution $e^Z$ is added to right and left-hand sides of equation (3), to thereby obtain an equation (7) as follows:

$$E\left[(e^{f_3} + e^Z)^2\right] = E\left[((e^{f_1} + e^{f_2}) + e^Z)^2\right] \quad (7)$$

$$\rightarrow E[e^{f_3} e^Z] = E[e^{f_1} e^Z + e^{f_2} e^Z]$$

$$\rightarrow E[e^{f_3}]e^{\sum_{j=1}^{n} c_j z_j} = E[e^{f_1}]e^{\sum_{j=1}^{n} a_j z_j} + E[e^{f_2}]e^{\sum_{j=1}^{n} b_j z_j};$$

Then, equation (7) may be expanded into a first order Taylor series and the Taylor series of equation (7) may expanded into an identical equation with respect to an arbitrary random variable z of the arbitrary lognormal distribution $e^Z$.

In an example embodiment, the global parameter may includes a chip-based variable which may be involved with the leakage current by the chip and an inner-chip variable having spatial correlation between the leakage currents in the chip and the local parameter may include the variables having no spatial correlation between the leakage currents in the chip.

In an example embodiment, the first and the second leakage currents may include one of a sub-threshold leakage current and a gate leakage current, respectively.

In an example embodiment, the virtual cell leakage characteristic function may includes a PDF of a lognormal distribution of which the exponential term is a polynomial of a normal distribution having an average of $c_0$ and a variation of $$\sum_{j=1}^{n+1} c_j^2$$

so that the virtual cell leakage characteristic function is expressed as equation (8), $$e^{c_0 + \sum_{j=1}^{n} c_j P_j + c_{m+1} R} \tag{8}$$

(wherein, R denotes a local parameter having no spatial correlation between the cells in the segment and m denotes a number of the process parameters that are not treated as the local parameter in the segment). Then, the segment leakage characteristic function may be generated by arithmetically adding the virtual cell leakage characteristic function expressed by equation (8) at every cell in the segment. The segment leakage characteristic function may include a PDF of a lognormal distribution of which the exponential term may be a polynomial of a normal distribution.

In an example embodiment, the virtual cell leakage characteristic function may be arithmetically added to each other as follows. A second moment equivalence condition of a lognormal distribution composition may be applied in Wilkinson's method, to thereby obtain an exponential polynomial equation. Then, the exponential polynomial equation may be expanded into a first order Taylor series, and the Taylor series of the exponential polynomial equation may be into an identical equation with respect to a random variable of an arbitrary lognormal distribution. In such a case, the segment leakage characteristic function may include one of a sub-threshold leakage current and a gate leakage current.

In an example embodiment, the step of the generating the full chip leakage characteristic function may include obtaining an average and a variation by using first and second moments of a number of the segment leakage characteristic functions.

In an example embodiment, the actual leakage characteristic function may be obtained by analyzing experimental data including the leakage currents and the process parameters. For example, the actual leakage characteristic function may be obtained by a regression analysis process onto the experimental data, so that a statistical relation between the leakage current and the process parameter is generated.

In an example embodiment, the process parameter may include a global parameter having a chip-based variable which may be involved with the leakage current by the chip and an inner-chip variable which has spatial correlation between the leakage currents in the chip and the local parameter includes the variables having no spatial correlation between the leakage currents in the chip.

In an example embodiment, the process parameter may include a random parameter having relation to a random variation that may be randomly caused by environmental factors in performing a process and a systematic parameter having relation to a systematic variation that may be caused by physical factors of a process system for performing the process.

In an example embodiment, the random variation may be expressed as a PDF having the random parameter as a variable which may determine a probability distribution and the systematic variation may be expressed as a spatial correlation matrix.

In an example embodiment, the process parameter may include one of a temperature of a deposition process, a thickness of a deposited layer, a pattern width and a gate voltage.

In an example embodiment, a variation analysis may be further performed by arithmetically operating the virtual cell leakage characteristic function and a supplemental leakage characteristic function that may determine a supplemental leakage current generated from the cell, to thereby analyze variation of the virtual cell leakage characteristic function due to the supplemental leakage characteristic function.

According to some example embodiments, lognormal distributions about a leakage characteristic function may be summed up not by a statistical process but by an arithmetic process using an exponential polynomial of the PDF of a lognormal distribution. Therefore, the complexity of Wilkinson's method for generating a full chip leakage characteristic function may be remarkably reduced without any deterioration of the accuracy of the full chip leakage characteristic function.

In addition, when performing a principal component analysis (PCA) on a wafer chip, a computational overload for processing a spatial correlation matrix may be sufficiently minimized. Furthermore, a variation analysis for analyzing the effect of a variation of an actual leakage characteristic function on a virtual cell leakage characteristic function, which may be known as an incremental analysis in the conventional Wilkinson's method, may be performed merely by a series of arithmetic operations, to thereby sufficiently reduce the computational loads of the conventional Wilkinson's method.

DETAILED DESCRIPTION OF THE EMBODIMENTS

Figure 1:
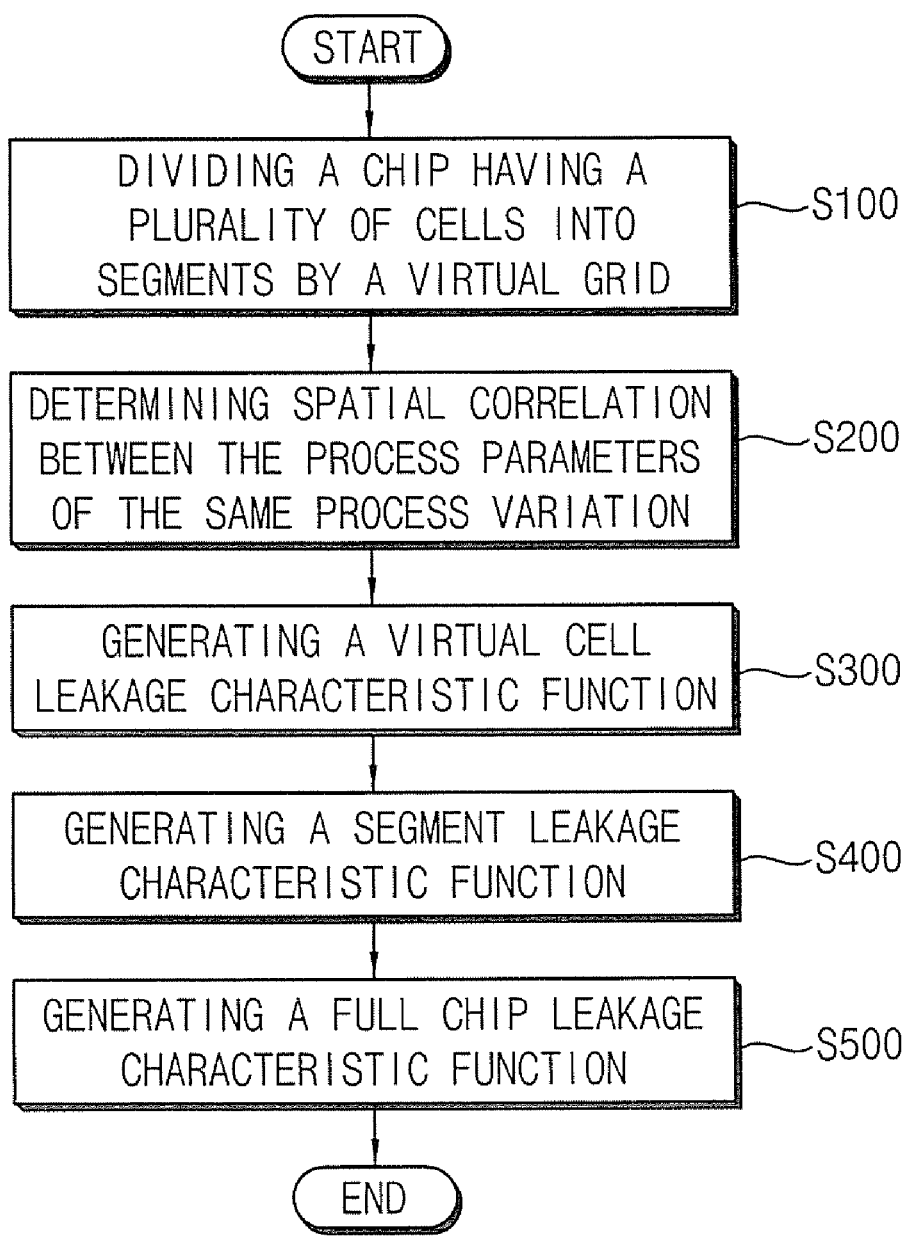
FIG. 1 is a flowchart showing a method of estimating a full chip leakage current for a semiconductor device.

Various example embodiments will be described more fully hereinafter with reference to the accompanying drawings, in which some example embodiments are shown. The present invention may, however, be embodied in many different forms and should not be construed as limited to the example embodiments set forth herein. Rather, these example embodiments are provided so that this disclosure will be thorough and complete, and will fully convey the scope of the present invention to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, example embodiments will be explained in detail with reference to the accompanying drawings.

Figure 2:
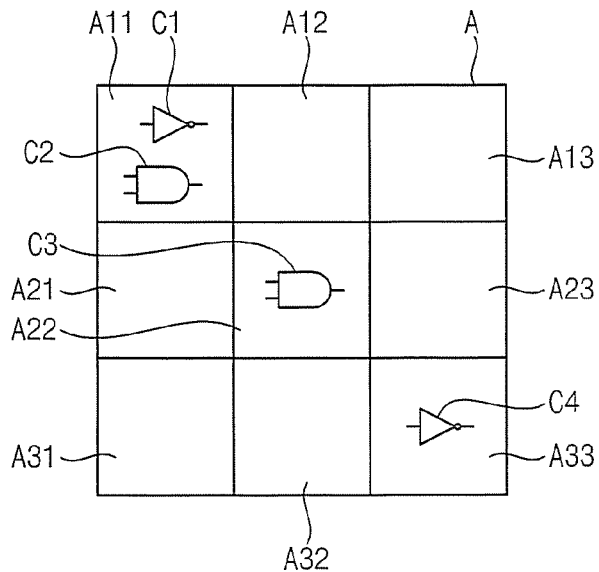
FIG. 2 is a plan view illustrating a chip on a wafer on which a plurality of segments is formed in accordance with a grid model.

FIG. 1 is a flowchart showing a method of estimating a full chip leakage current for a semiconductor device. FIG. 2 is a plan view illustrating a chip on a wafer on which a plurality of segments is formed in accordance with a grid model.

Referring to FIGS. 1 and 2, a wafer chip 100 may be divided into a plurality of segments for estimating a full chip leakage current in accordance with an example embodiment of the present inventive concept (step S100). The wafer chip may include a plurality of cells on which various conductive structures for integrated circuits are arranged.

In an example embodiment, the wafer chip 100 may include a DRAM device having a transistor and a capacitor as an operating unit and a flash memory device having a selection transistor, a cell transistor and a ground transistor, which are arranged in a line, as an operating unit. A surface of the wafer chip 100 may be divided into a plurality of segments A by a virtual grid and a plurality of cells may be positioned in each of the segments A. A plurality of the operating units may be positioned in each of the cells.

In the present example embodiment, the wafer chip 100 may be divided into nine segments A and each of the segments A may be designated by a matrix index. Various conductive structures may be formed on each of the segments A in accordance with manufacturing process on a wafer. For example, first and second conductive structures C1 and C2, which are different from each other, may be formed on a first segment $A_{11}$ and a third and a fourth conductive structures C3 and C4 may be formed on a fifth segment $A_{22}$ and a ninth segment $A_{33}$, respectively. The third and/or fourth conductive structures C3 and C4 may be substantially identical to the first and/or second conductive structures C1 and C2, as would be known to one of ordinary skill in the art.

A local leakage current may be generated from each of the segments A of the wafer chip 100 and a total current leakage generated from the wafer chip 100 (full chip leakage current) may be estimated by the following process.

At first, various process variations, which may cause the local leakage current at each cell, may be detected and every process parameter corresponding to the process variation may be found at each of the cells. Then, a spatial correlation may be determined between the process parameters of the same process variation on the wafer chip 100 (step S200).

In an example embodiment, various pattern variations may be generated by various factors in a manufacturing process for a semiconductor device and the leakage current in a transistor may be influenced by the pattern variations. For example, a size or a shape of a pattern may be changed by lens distortion in an exposure process or variations of process conditions in an etching process. The pattern variations over an allowable range may cause process failures in each unit process of the manufacturing process. The pattern variations in the manufacturing process for a semiconductor device may include a random variation caused by variations of process conditions and a systematic variation caused by characteristics and specifications of systems or equipment for performing the unit process.

The random variation indicates a kind of the pattern variation that may be arbitrarily generated in accordance with process conditions and wafer conditions, and thus a statistical estimation model having each of process parameters of a specific unit process as a random variable may provide an accurate performance variation of a semiconductor device in relation to the process parameter. For example, the leakage current due to the random variation may be described by a probability density function (PDF) with respect to the random variable in relation to the random variation.

The systematic variation indicates a kind of pattern variation that may be generated due to systematic factors of physical equipment for performing the process and is a relative variation of the pattern at a local area with respect to a reference local area. For example, the systematic factors of physical equipment may include instrumental effects on a respective layout and position variation of a wafer in the equipment. Therefore, the systematic variation may be numerically quantified by a spacious correlation based on each position function of the local area of the wafer, not by a unique PDF with respect to a specific process parameter in case of the random variation.

For example, although the second conductive structure C2 on the first segment A11 may be the same as the third conductive structure on the fifth area A22, the probability of the pattern variations may be different from each other because the first and fifth conductive structures may be positioned at different area of the wafer chip 100. Thus, the probability difference of the pattern variation of each conductive structure at each of the segments and statistical correlation between the same conductive structures at different segments may be determined on the wafer chip 100, to thereby obtain the spacious correlation between the process parameters.

For example, the process parameter may include a deposition temperature and a thickness of a deposited layer in a deposition process, a line width of a pattern and a voltage of a gate electrode (Vdd).

Then, an actual leakage characteristic function indicating a PDF of a leakage current generated from a particular structure may be determined in a cell of the wafer chip 100, to thereby generate various actual leakage characteristic functions at the cell. Thereafter, the various actual leakage characteristic functions may be statistically summed up to generate a virtual cell leakage characteristic function indicating a PDF of a total leakage current generated from the cell of the wafer chip 100 (step S300).

Various actual leakage currents may be generated at each of the cells of the wafer chip 100 in accordance with mechanical characteristics of leakage and processing limitations and the processing parameters corresponding each of the actual leakage currents may be the same or different from each other.

A particular process parameter, which may be involved with a specific actual leakage current and have no effect on the other actual leakage currents, may be defined as a local variable and another particular process parameter, which may be commonly involved with all of the actual leakage currents, may be defined as a global variable. The global variables may include a chip-based variable which may be involved with the actual leakage current by the chip and an inner-chip variable having spatial correlation between the actual leakage currents in the chip. The local variables may include all of the inner-chip variables and the outer-chip variables having no spatial correlation between the actual leakage currents in the chip.

Figure 3:
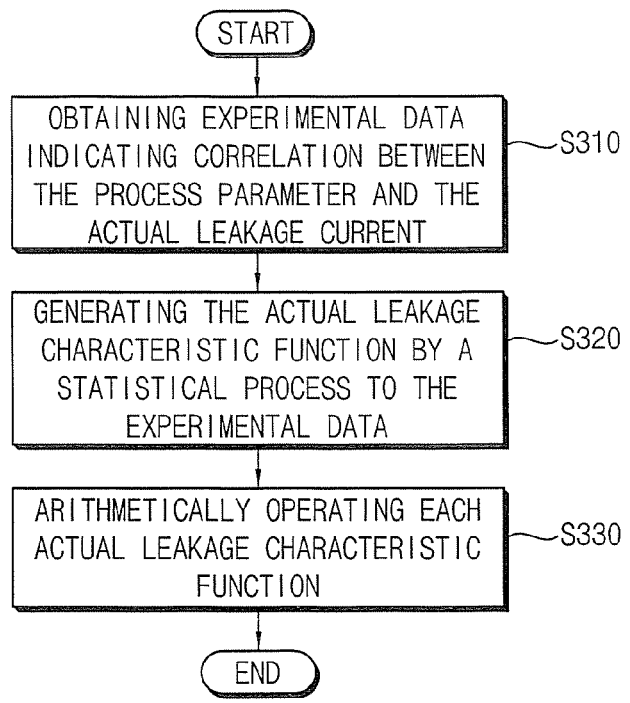
FIG. 3 is a flowchart showing processing steps for generating the virtual cell leakage characteristic function shown in FIG. 1.

FIG. 3 is a flowchart showing processing steps for generating the virtual cell leakage characteristic function shown in FIG. 1.

In an example embodiment, an object wafer on which various conductive structures and patterns may have been formed in a manufacturing process may be inspected and various experimental data indicating correlation between each of the process parameters and each of the actual leakage current may be obtained (step S310) by various well-known inspection processes. Then, the experimental data may be statistically processed to thereby generate an exponential polynomial as the actual leakage characteristic function (step S320).

For example, repeated inspection processes may be performed on an experimental chip for inspecting the leakage current characteristics and various experimental data indicating the correlation between the actual leakage current and the process parameter may be obtained and stored in a predetermined data structure. Then, the data structure may be statistically treated by a statistical model to thereby generate the actual leakage characteristic function in a circuit design stage.

The data structure of the correlation between the actual leakage current and the process parameter may be statistically treated by a regression analysis method, and thus the actual leakage characteristic function may be expressed as a PDF with respect to the actual current leakage (hereinafter referred to as actual leakage PDF).

Accordingly, the actual current leakage may be generated at a particular cell of a specific segment of the wafer chip 100 in accordance with a lognormal distribution defined by a PDF with respect to the above local and global variables as the following equation (1).

$$e^{a_0 + \sum_{j=1}^{n} a_j P_j + a_{n+1} R} \tag{1}$$

The polynomial expression in the PDF of equation (1) may indicate statistical correlation between the process parameter and a specific actual leakage current at a specific cell through the regression analysis method. The random variables of P and R in the above equation (1) may be varied in accordance with a normal distribution having an average of $a_0$ and a standard variation of $$\sum_{j=1}^{n+1} a_j^2,$$

and the coefficient a in the above equation (1) may include an eigenvalue for fitting the actual leakage current to a respective process parameter (hereinafter referred to as fitting coefficient).

That is, the actual leakage characteristic function may be a PDF of a lognormal distribution since the exponential term of equation (1) may define the normal distribution.

Various actual leakage currents may be measured from the segment of the wafer chip 100 and the actual leakage characteristic functions may be generated with respect to each of the actual leakage currents, respectively in every feasible cell of the same segment through the regression analysis method. Thus, a number of the actual leakage characteristic functions may be generated with respect to every actual leakage current in the feasible cells of the wafer chip 100.

In the present example embodiment, the virtual leakage characteristic function may be generated by the following process supposing that two kinds of the actual leakage currents are measured in the same segment of the wafer chip 100. However, when three or more kinds of the actual leakage currents may be measured in the same segment, the virtual leakage characteristic function may also be generated by the same process, as would be known to one of the ordinary skill in the art.

A first leakage current may be distributed in accordance with a first PDF as described in the above equation (1) and a second leakage current may be distributed in accordance with a second PDF as described in the following equation (2).

$$e^{b_0 + \sum_{j=1}^{n} b_j P_j + b_{n+1} R} \quad (2)$$

The exponential term in the second PDF of equation (2) may define a normal distribution having an average of $b_0$ and a standard variation of $$\sum_{j=1}^{n+1} b_j^2,$$

and the coefficient b may be the fitting coefficient of the second PDF. Accordingly, the actual leakage characteristic function corresponding to the second actual leakage current may be a PDF of a lognormal distribution since the exponential term of equation (2) may define the normal distribution.

Then, each of the actual leakage characteristic functions corresponding to the first and second actual leakage current may be operated arithmetically, not statistically, to thereby generate a third PDF as a virtual cell leakage characteristic function with respect to the specific cell of the segment (step S330).

Supposing that the first, second and third PDF is described as $e^A$, $e^B$ and $e^C$, respectively, the virtual cell leakage characteristic function may be approximated to the following equation (3).

$$e^A + e^B = e^C \quad (3)$$

Accordingly, equation (3) may be described into the polynomial type as follows by equation (3-1).

$$e^{a_0 + \sum_{j=1}^{n} a_j P_j + a_{n+1} R} + e^{b_0 + \sum_{j=1}^{n} b_j P_j + b_{n+1} R} = e^{c_0 + \sum_{j=1}^{n} c_j P_j + c_{n+1} R} \quad (3\text{-}1)$$

The polynomials at the exponential terms of equation (3) may be treated arithmetically, not statistically, as will be described hereinafter to thereby reduce the computational load as compared with the conventional Wilkinson's method. Determination of the coefficient $c_j$ in the above equation (3-1) requires (n+2) simultaneous equations. Among the (n+2) equations, two equations may be obtained by a statistical method and the rest of the n equations may be obtained by a correlation analysis between the actual leakage currents. Then, a solution of the (n+2) simultaneous linear equations may determine the coefficient $c_j$ in the above equation (3-1), to thereby generate the third PDE The above two equations obtained by a statistical method may be a first moment and a second moment of the third PDF described as follows.

An average and a variation of the third PDF may be $\mu_c$ and $\sigma_c$, respectively, according to the following equations (4) and (5).

$$\mu_c = 2\ln(M_1) - \frac{1}{2}\ln(M_2) = c_0 \quad (4)$$

$$\sigma_c^2 = \ln(M_2) - 2\ln(M_1) = \sum_{j=1}^{n+1} c_j^2 \quad (5)$$

In the above equations (4) and (5), $M_1$ and $M_2$ indicate the first and second moments of the third PDF statistically obtained by Wilkinson's method, respectively.

So as to obtain the other n equations, an arbitrary supplemental lognormal distribution with respect to an arbitrary actual leakage current may be added at the right-hand side and the left-hand side of equation (3). When two arbitrary lognormal distributions is summed up, the summation process of the present example embodiment may be substantially the same as the conventional Wilkinson's method. However, when another lognormal distribution may be added to the summation results of the two lognormal distributions, the summation process of the present example embodiment may be clearly different from the conventional Wilkinson's method. The differentiation of the summation between the conventional Wilkinson's method and the present inventive concept lies in correlation between the right-hand-side supplemental lognormal distribution and the left-hand-side supplemental lognormal distribution in the above equation (3).

According to the conventional Wilkinson's method, two arbitrary lognormal distributions are statistically summed up to generate a first composed lognormal distribution that is completely different from the original lognormal distributions and is statistically equivalent to the summation of the original lognormal distributions. Thus, the original lognormal distributions with respect to a process parameter is completely replaced by a new lognormal distribution, the first composed lognormal distribution, with respect to the same process parameter that is statistically equivalent to the summation of the original lognormal distributions. Adding the supplemental lognormal distribution to the first composed lognormal distribution may generate a second composed lognormal distribution that is completely different from the first composed lognormal distribution and is statistically equivalent to the summation of the supplemental lognormal distribution and the first composed lognormal distribution. Therefore, an actual supplemental leakage current represented by the supplemental lognormal distribution may have statistical correlation with a virtual equivalent leakage current represented by the first composed lognormal distribution and may not have statistical correlation with the actual leakage currents represented by the original lognormal distributions.

For the above reasons, the second composed lognormal distribution at the left-hand side of equation (3), i.e., the summation results of the supplemental lognormal distribution to the left-hand side of equation (3), may not be statistically correlated with the summation results of the supplemental lognormal distribution to the right-hand side of equation (3). That is, the second composed lognormal distribution at the left-hand side of equation (3) may have operational errors in view of the summation results at the right-hand side of equation (3). So as to eliminate the operational errors in the second composed lognormal distribution, the summation process for generating the second composed lognormal distribution needs to include the summation process for generating the first composed lognormal distribution. That is, the summation of the lognormal distributions at the left-hand side of equation (3) may be processed simultaneously, not sequentially or step by step. As a result, the computational loads of the conventional Wilkinson's method may be tremendously increased according to an increase of the number of the added lognormal distributions.

However, when equation (3) may come into existence irrespectively of the supplemental lognormal distribution added to the right and left-hand sides thereof, the equivalent lognormal distribution may be accurately generated merely by arithmetic summation of the lognormal distributions, not by statistical summation of the lognormal distribution. The arithmetic equivalent lognormal distribution may preserve the statistical correlation between the actual leakage currents with respect to the process parameter, and thus sufficiently eliminate the operation errors of the conventional Wilkinson's method.

Supposing that the supplementary lognormal distribution is represented as $e^z$, the adding of the supplementary lognormal distribution to equation (3) may be expressed as the following equation (6).

$$(e^A + e^B) + e^Z = e^C + e^Z \tag{6}$$

So as to be statistically equal between the left and right-hand sides of equation (6), the first and second moments at the left and right-hand sides of equation (6) need equal to each other, respectively. The first and second moments of equation (6) may be represented as the following equations (7) and (8).

$$E[e^C + e^Z] = E[e^A + e^B] + E[e^Z] = E[e^A + e^B + e^C] \tag{7}$$

$$E[(e^C + e^Z)^2] = E[((e^A + e^B) + e^Z)^2] \rightarrow E[e^C e^Z] = E[e^A e^Z + e^B e^Z] \tag{8}$$

Equation (8) is expressed as the following equation (9).

$$e^{c_0 + (\sum_{j=1}^{n+1} c_j^2)/2 + \sum_{j=1}^{n} c_j z_j} = e^{a_0 + (\sum_{j=1}^{n+1} a_j^2)/2 + \sum_{j=1}^{n} a_j z_j} + e^{b_0 + (\sum_{j=1}^{n+1} b_j^2)/2 + \sum_{j=1}^{n} b_j z_j} \tag{9}$$

Subsequently, the following equation (10) is induced from equation (9).

$$E[e^C] e^{\sum_{j=1}^{n} c_j z_j} = E[e^A] e^{\sum_{j=1}^{n} a_j z_j} + E[e^B] e^{\sum_{j=1}^{n} b_j z_j} \tag{10}$$

Accordingly, when the coefficient $c_j$ may be determined irrespectively of the arbitrary supplemental lognormal distribution Z, and thus equation (10) may become an identical equation with respect to the distribution Z, the polynomials for the third lognormal distribution $e^C$ may be determined irrespective of the added lognormal distributions.

However, as equation (10) may be very complicated, modified equations of equation (10) may be used for determining the $c_j$.

For example, equation (10) may be expanded into a first order Taylor series and the Taylor series may be arranged with respect to the Z on condition that equation (10) may be an identical equation with respect to the distribution Z, as shown in the following equation (11).

$$E[e^C] e^{\sum_{j=1}^{n} c_j z_j} \left( \sum_{j=1}^{n} c_j (z_j - k_j) \right) = E[e^A] e^{\sum_{j=1}^{n} a_j z_j} \left( \sum_{j=1}^{n} a_j (z_j - k_j) \right) + E[e^B] e^{\sum_{j=1}^{n} b_j z_j} \left( \sum_{j=1}^{n} b_j (z_j - k_j) \right) \tag{11}$$

In the above equation (11), $k_j$ indicates an average of the coefficients of the lognormal distribution. The third lognormal distribution $e^C$ may include a summation of the actual leakage currents in the same cell, and thus is the same as the average of the coefficients of the first and second lognormal distributions $e^A$ and $e^B$.

The $c_j$ of the identical equation (11) may be determined as the following equation (12) irrespective of the Z.

$$c_j = \frac{E(e^A) e^{\sum_{j=1}^{n} a_j k_j} + E(e^B) e^{\sum_{j=1}^{n} b_j k_j}}{E(e^C) e^{\sum_{j=1}^{n} c_j k_j}} \tag{12}$$

Since $E[e^C] = E[e^A] + E[e^B]$, $$e^{\sum_{j=1}^{n} c_j k_j} = \frac{E(e^A) e^{\sum_{j=1}^{n} a_j k_j} + E(e^B) e^{\sum_{j=1}^{n} b_j k_j}}{E(e^C)} \tag{13}$$

Therefore, the coefficients $c_1$ to $c_n$ may be determined by equation (13) and the coefficient $c_{n+1}$ may be determined by the following equation (14).

$$c_{n+1} = \sqrt{\sigma_c^2 - \sum_{j=1}^{n} c_j^2} \tag{14}$$

Accordingly, the third lognormal distribution $e^C$, which may be an arithmetic summation of the first and second lognormal distributions $e^A$ and $e^B$, may be expressed as exponential polynomials irrespective of the arbitrarily added lognormal distribution $e^Z$.

As a result, various actual leakage currents in a cell of the wafer chip 100 may be arithmetically summed up step by step to thereby generate a single virtual equivalent leakage current of the cell, which may be expressed as the single virtual leakage characteristic function of the cell. Therefore, the equivalent leakage current may include all kinds of the actual leakage currents generated from the cell and the virtual leakage characteristic function may be statistically equivalent to all kinds of the actual leakage characteristic functions. Hereinafter, the cell of which the leakage characteristics is determined by the virtual leakage characteristic function is referred to as virtual cell.

Since the virtual leakage characteristic function may be obtained by arithmetic summation of the actual leakage characteristic functions, an effect of an arbitrary actual leakage current to the virtual equivalent leakage current of the virtual cell may be easily estimated according to the present example embodiment of the present inventive concept.

Supposing that an arbitrary virtual cell i of which the virtual leakage characteristic function is determined may include three kinds of the actual leakage characteristic functions A, B and C and another arbitrary virtual cell j may include three kinds of the actual leakage characteristic functions A, B and D, the virtual leakage characteristic function of the virtual cell j may easily be obtained by the following arithmetic operations.

$$f_{total)celli} = f(A) + f(B) + f(C) \quad (15)$$

$$f_{total)cellj} = f_{total)celli} - f(C) + f(D) \quad (16)$$

Accordingly, when the virtual leakage characteristic function of a first cell may be known, the virtual leakage characteristic function of a second cell having the known virtual leakage characteristic function or similar leakage characteristic function thereto as one of the actual leakage characteristic function thereof may be easily obtained merely by arithmetic operation of other actual leakage characteristic functions that are not common to both of the first and second cells. In the present embodiment, the actual leakage characteristic functions C and D are not common to both of the first and second cells and the actual leakage characteristic function C is subtracted from the known actual leakage characteristic function, which is the virtual leakage characteristic function of the first cell, and the actual leakage characteristic function D may be added to the known actual leakage characteristic function. Therefore, when the actual leakage characteristic functions of a cell may be similar to those of another cell, the virtual leakage characteristic function of the cell may be easily obtained with a remarkably reduced computational load.

In a modified example embodiment of the present example, the above arithmetic generation of the equivalent leakage characteristic function may also be used for an expectation model for expecting an effect of a supplemental actual leakage characteristic function on a virtual leakage characteristic function of an arbitrary virtual cell.

Supposing that an arbitrary virtual cell i of which the virtual equivalent leakage characteristic function is already known include three kinds of the actual leakage characteristic functions A, B and C and a supplemental actual leakage characteristic function D be added to the virtual cell i, the virtual equivalent leakage characteristic function of the arbitrary virtual cell i may be easily obtained merely by arithmetically adding the supplemental actual leakage characteristic function D to the known virtual equivalent leakage characteristic function, as shown in the following equations (17) and (18).

$$f_{total)original} = f(A) + f(B) + f(C) \quad (17)$$

$$f_{total)afteradding} = f_{total)original} + f(D) \quad (18)$$

In addition, when some of the actual leakage currents may be varied in a cell of the wafer chip 100, the variation of the equivalent leakage characteristic function of the virtual cell due to the variation of the actual leakage characteristic function may be easily estimated merely by the arithmetic treatment of the variation of the actual leakage characteristic function. That is, a variation analysis of the actual leakage characteristic function, which is substantially identical to an incremental analysis of the conventional Wilkinson's method, may be easily performed with a remarkably reduced computational load.

Furthermore, the variation analysis of the actual leakage characteristic function may be applied to a cell incremental analysis for analyzing the variation of the equivalent leakage characteristic function in case that the virtual cell may be added or deleted to/from the whole wafer chip 100. When each of the virtual leakage characteristic functions is determined with respect to all of the cells of the wafer chip 100 (i.e., a full chip leakage characteristic function may be determined on the wafer chip 100) and some of the cells may be deleted or changed in accordance with the requirements of the circuit design, the variation of the full chip leakage characteristic function due to the cell change may be easily obtained merely by the arithmetic operation without any re-calculation of the full chip leakage characteristic function in consideration of the cell change. Therefore, the variation of the full chip leakage characteristic function due to the cell change may be easily estimated in designing an electric circuit without any additional computational load.

A number of the virtual cell leakage characteristic functions may be arithmetically added to one another in the same segment, to thereby generate a segment leakage characteristic function (step S400).

When a single cell is positioned in the segment A, the virtual cell leakage characteristic function may function as the segment leakage characteristic function and when a number of cells may be positioned in the segments A, the arithmetic summation of the virtual cell leakage characteristic functions may function as the segment leakage characteristic function.

Since the virtual cell leakage characteristic function may be described as an exponential polynomial of the lognormal distribution of which the coefficients are determined not by a statistical process but by an arithmetic process, the segment leakage characteristic function may also be obtained by the same arithmetic summation of the virtual cell leakage characteristic functions. Thus, detailed descriptions on the arithmetic summation process for adding the virtual cell leakage characteristic functions will be omitted.

However, when the actual leakage currents may be cased by different process parameters, respectively, the actual leakage currents may not be represented as a single random variable, and thus the virtual cell leakage characteristic function may not be equivalent with the actual leakage currents. Therefore, the actual leakage currents concerning different respective process parameters may not be arithmetically added to one another as an exponential polynomial even though the actual leakage currents may be generated in the same segment A.

For example, when two different processes may be performed on a first cell and a second cell, respectively, the threshold voltage of the first cell may be independent from that of the second cell, and thus the different threshold voltages of the first and second cells cannot be treated as a single random variable. Therefore, the leakage currents generated from the first cell and second cell may not be arithmetically added to each other by the same process as described above using an exponential polynomial. However, only if the first and the second cells may be under the same process conditions, the actual leakage currents may be arithmetically added to each other although the physical mechanisms of the actual leakage currents may be different from each other like a sub-threshold leakage current and a gate leakage current.

Then, the segment leakage currents may be statistically added to one another, to thereby generate a single full chip leakage characteristic function dominating an overall leakage current generated from the whole wafer chip 100 (step S500).

In an example embodiment, the full chip leakage characteristic function may be generated by a statistical process to thereby increase the accuracy of the leakage characteristic function. For example, a number of the segment leakage characteristic functions may be added to one another by the conventional Wilkinson's method, to thereby estimate the PDF of the full chip leakage characteristic function.

In case that the full chip leakage characteristic function may be generated by the statistical process, an average and variation of the full chip leakage characteristic function may be determined by Wilkinson's method using the average and variation of the segment leakage characteristic function. Accordingly, the full chip leakage characteristic function may be determined as a statistical distribution, not as an exponential polynomial. A total leakage current may be sufficiently estimated by using the statistical distribution of the full chip leakage characteristic function.

The complexity of Wilkinson's method for determining the full chip leakage characteristic function may be varied according to the number of the virtual cells. However, various cells in the same wafer chip 100 may be substantially under the same process conditions. Therefore, supposing that an ignorable number of the cells may be under different process parameters, the complexity of Wilkinson's method for generating the full chip leakage characteristic function may be substantially approximated to the number of the segments A of the grid model.

As a result, the complexity of Wilkinson's method for generating the full chip leakage characteristic function may be remarkably reduced in compared with the conventional case where each of the actual leakage characteristic functions may be treated by Wilkinson's method.

According to some example embodiments, lognormal distributions about a leakage characteristic function may be summed up not by a statistical process but by an arithmetic process using an exponential polynomial of the PDF of the lognormal distribution. Therefore, the complexity of Wilkinson's method for generating a full chip leakage characteristic function may be remarkably reduced without any deterioration of the accuracy of the full chip leakage characteristic function.

In addition, when performing a principal component analysis (PCA) on a wafer chip, a computational overload for processing a spatial correlation matrix may be sufficiently minimized. Furthermore, a variation analysis for analyzing the effect of the variation of an actual leakage characteristic function on a virtual cell leakage characteristic function, which may be known as an incremental analysis in the conventional Wilkinson's method, may be performed merely by a series of arithmetic operations, to thereby sufficiently reduce the computational loads of the conventional Wilkinson's method.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present invention. Accordingly, all such modifications are intended to be included within the scope of the present invention as defined in the claims. In the claims, means-plus-function clauses are intended to cover the structures described herein as performing the recited function and not only structural equivalents but also equivalent structures. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A method of estimating a leakage current in a semiconductor device, comprising:

dividing a chip on a substrate into a plurality of segments, the chip including a plurality of cells on which various unit conductive structures of an integrated circuit are formed;

determining spatial correlation between process parameters that are concerned with leakage currents in each of the cells;

generating a virtual cell leakage characteristic function of a cell by using a computer to arithmetically operate actual leakage characteristic functions that determine the leakage currents generated from the cell, respectively, the virtual cell leakage characteristic function being equivalent to actual leakage characteristic functions, and a virtual leakage current generated by the virtual cell leakage characteristic function being equivalent with the leakage currents in the cell;

generating a segment leakage characteristic function of a segment by arithmetically operating the virtual cell leakage characteristic functions of all cells in the segment, the segment leakage characteristic function determining a virtual leakage current generated from all of the cells in the segment; and generating a full chip leakage characteristic function of the chip by statistically operating the segment leakage characteristic functions of all segments in the chip, the full chip leakage characteristic function determining a virtual leakage current generated from the entirety of the chip of the semiconductor device.

2. The method of claim 1, wherein the actual leakage characteristic function and the virtual cell leakage characteristic function is expressed as an exponential polynomial with respect to the process parameters.

3. The method of claim 2, wherein the actual leakage characteristic function includes a first probability density function (PDF) determining a first leakage current caused by the process parameter and expressed as equation (1) and a second PDF determining a second leakage current caused by the process parameter and expressed as equation (2) given below, $$e^{f_1(P_1, P_2, \ldots, P_n)} \tag{1},$$

$$e^{f_2(P_1, P_2, \ldots, P_n)} \tag{2},$$

and the virtual cell leakage characteristic function includes a third PDF that equals arithmetic summation of the first PDF and the second PDF, and thus expressed as equation (3) given below, $$e^{f_3(P_1, P_2, \ldots, P_n)} = e^{f_1(P_1, P_2, \ldots, P_n)} + e^{f_2(P_1, P_2, \ldots, P_n)} \tag{3},$$

(wherein each lower case letter e in the above equations indicates a natural log and $p_i$ indicates the i-th process parameter that causes the leakage current in the cell).

4. The method of claim 3, wherein an exponential term of the first PDF includes a polynomial of a normal distribution having an average of $\alpha_0$ and a variation of $$\sum_{j=1}^{n+1} a_j^2$$

so that the first PDF is expressed as equation (4) indicating a lognormal distribution, $$e^{a_0 + \sum_{j=1}^{n} a_j P_j + a_{n+1} R}, \tag{4}$$

an exponential term of the second PDF includes a polynomial of a normal distribution having an average of $b_0$ and a variation of $$\sum_{j=1}^{n+1} b_j^2$$

so that the second PDF is expressed as equation (5) indicating a lognormal distribution, $$e^{b_0+\sum_{j=1}^{n}b_jP_j+b_{n+1}R}, \quad (5)$$

and an exponential term of the third PDF includes a polynomial of a normal distribution having an average of $c_0$ and a variation of $$\sum_{j=1}^{n+1}c_j^2$$

so that the second PDF is expressed as equation (6) indicating a lognormal distribution, $$e^{c_0+\sum_{j=1}^{n}c_jP_j+c_{n+1}R}, \quad (6)$$

on condition that $$c_0 = 2\ln(M_1) - \frac{1}{2}\ln(M_2), \quad \sum_{j=1}^{n+1}c_j^2 = \ln(M_2) - 2\ln(M_1),$$

$$c_j = \frac{E(e^{f_1})e^{\sum_{j=1}^{n}a_jk_j}a_j + E(e^{f_2})e^{\sum_{j=1}^{n}b_jk_j}b_j}{E(e^{f_3})e^{\sum_{j=1}^{n}c_jk_j}}, \text{ and}$$

$$c_{n+1} = \sqrt{\sigma_c^2 - \sum_{j=1}^{n}c_j^2},$$

wherein each of $a_j$, $b_j$, and $c_j$ denotes a fitting coefficient of a normal distribution, M1 denotes a first moment of the third PDF and M2 denotes a second moment of the third PDF, R denotes a local parameter by which the first and the second leakage currents are generated independently from each other and $P_j$ denotes a global parameter by which both of the first and the second leakage currents are commonly generated.

5. The method of claim 4, wherein the first and second moments of the third PDF are statistically obtained as follows:

$$M_1=E[e^{f_1}+e^{f_2}], M_2=E[(e^{f_1}+e^{f_2})^2],$$

wherein $e^{f_1}$ and $e^{f_2}$ denote first and second lognormal distributions, respectively.

6. The method of claim 4, wherein the fitting coefficient $c_j$ is obtained through steps of:
applying a second moment equivalence condition of a lognormal distribution composition in Wilkinson's method on condition that an arbitrary lognormal distribution $e^z$ is added to right and left-hand sides of equation (3), to thereby obtain an equation (7) as follows:

$$E\left[(e^{f_3}+e^z)^2\right] = E\left[((e^{f_1}+e^{f_2})+e^z)^2\right] \quad (7)$$
$$\to E[e^{f_3}e^z] = E[e^{f_1}e^z + e^{f_2}e^z]$$
$$\to E[e^{f_3}]e^{\overline{\sum_{j=1}^{n}c_jz_j}} = E[e^{f_1}]e^{\overline{\sum_{j=1}^{n}a_jz_j}} + E[e^{f_2}]e^{\overline{\sum_{j=1}^{n}b_jz_j}};$$

expressing equation (7) into a first order Taylor series; and
expressing the Taylor series of equation (7) into an identical equation with respect to an arbitrary random variable z of the arbitrary lognormal distribution $e^z$.

7. The method of claim 4, wherein the global parameter includes a chip-based variable which is involved in the leakage current in the chip and an inner-chip variable having the spatial correlation between the leakage currents in the chip and the local parameter includes the variables having no spatial correlation between the leakage currents in the chip.

8. The method of claim 3, wherein the first and the second leakage currents include a sub-threshold leakage current and a gate leakage current, respectively.

9. The method of claim 1, wherein the virtual cell leakage characteristic function includes a PDF of a lognormal distribution of which an exponential term is a polynomial of a normal distribution having an average of $c_0$ and a variation of $$\sum_{j=1}^{n+1}c_j^2$$

so that the virtual cell leakage characteristic function is expressed as equation (8), $$e^{c_0+\sum_{j=1}^{m}c_jP_j+c_{m+1}R} \quad (8)$$

(wherein R denotes a local parameter having no spatial correlation between the cells in the segment and m denotes a number of the process parameters that are not treated as the local parameter in the segment), and the segment leakage characteristic function is generated by arithmetically adding the virtual cell leakage characteristic function expressed by equation (8) at every cell in the segment.

10. The method of claim 9, wherein the segment leakage characteristic function includes a PDF of a lognormal distribution of which the exponential term is a polynomial of a normal distribution.

11. The method of claim 10, wherein the arithmetically adding the virtual cell leakage characteristic function includes:
applying a second moment equivalence condition of a lognormal distribution composition in Wilkinson's method, to thereby obtain an exponential polynomial equation;
expressing the exponential polynomial equation into a first order Taylor series; and
expressing the first order Taylor series of the exponential polynomial equation into an identical equation with respect to a random variable of an arbitrary lognormal distribution.

12. The method of claim 9, wherein the segment leakage characteristic function includes one of a sub-threshold leakage current and a gate leakage current.

13. The method of claim 1, wherein the generating a full chip leakage characteristic function includes obtaining an average and a variation by using a first moment and a second moment of a number of the segment leakage characteristic functions.

14. The method of claim 1, wherein the actual leakage characteristic function is obtained by analyzing experimental data including the leakage currents and the process parameters.

15. The method of claim 14, wherein the analyzing experimental data includes performing a regression analysis process onto the experimental data, so that a statistical relation between a leakage current and a process parameter is generated.

16. The method of claim 14, wherein the process parameters include a global parameter having a chip-based variable which is involved in the leakage current in the chip and an inner-chip variable which has the spatial correlation between the leakage currents in the chip and a local parameter includes the variables having no spatial correlation between the leakage currents in the chip.

17. The method of claim 16, wherein the process parameters include a random parameter having relation to a random variation that is randomly caused by environmental factors in performing a process and a systematic parameter having relation to a systematic variation that is caused by physical factors of a process system for performing the process.

18. The method of claim 17, wherein the random variation is expressed as a PDF having the random parameter as a variable which determines a probability distribution and the systematic variation is expressed as a spatial correlation matrix.

19. The method of claim 17, wherein the process parameters include one of a temperature of a deposition process, a thickness of a deposited layer, a pattern width and a gate voltage.

20. The method of claim 1, further comprising performing a variation analysis by arithmetically operating the virtual cell leakage characteristic function and a supplemental leakage characteristic function that determines a supplemental leakage current generated from the cell, to thereby analyze variation of the virtual cell leakage characteristic function due to the supplemental leakage characteristic function.

* * * * *